United States Patent
Menolfi et al.

(10) Patent No.: US 8,749,268 B2
(45) Date of Patent: Jun. 10, 2014

(54) HIGH-SPEED DRIVER CIRCUIT

(71) Applicant: International Business Machines Corporation, Armonk, NY (US)

(72) Inventors: Christian I. Menolfi, Rueschlikon (CH); Thomas H. Toifl, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 13/688,367

(22) Filed: Nov. 29, 2012

(65) Prior Publication Data

US 2013/0135006 A1 May 30, 2013

(30) Foreign Application Priority Data

Nov. 29, 2011 (EP) ..................................... 11191065

(51) Int. Cl.
*H03K 17/16* (2006.01)
*H03K 19/003* (2006.01)
*H03K 19/00* (2006.01)

(52) U.S. Cl.
CPC ...... *H03K 19/0005* (2013.01); *H03K 19/00369* (2013.01); *H03K 19/00384* (2013.01)
USPC .................... 326/30; 326/27; 326/28; 326/87

(58) Field of Classification Search
USPC ...................................................... 326/30, 87
See application file for complete search history.

(56) References Cited

U.S. PATENT DOCUMENTS

| | | | |
|---|---|---|---|
| 7,123,055 B1 * | 10/2006 | Chong et al. ..................... | 326/87 |
| 7,511,530 B1 | 3/2009 | Cox | |
| 2006/0197556 A1 * | 9/2006 | Kang et al. ...................... | 326/87 |

OTHER PUBLICATIONS

C. Menolfi et al., "A 16 Gb/s source-series terminated transmitter in 65 nm CMOS SOI", ISSCC, Digital Technical Papers, pp. 446-447, Feb. 2007.

* cited by examiner

*Primary Examiner* — Ahn Tran
(74) *Attorney, Agent, or Firm* — William Stock; Anne Vachon Dougherty

(57) ABSTRACT

An inverter-type high speed driver circuit having a first inverter branch and a second inverter branch wherein each of the inverter branches comprising a parallel circuit of a serial connection of a first impedance tuning unit and a respective first clocking transistor and a serial connection of a second impedance tuning unit and a respective second clocking transistor. The impedance tuning units are configured to adapt the conductivity of the respective inverter branch to set the output impedance of the driver circuit and each of the impedance tuning units is controlled in accordance with a data stream.

7 Claims, 3 Drawing Sheets

HIGH-SPEED DRIVER CIRCUIT

TECHNICAL FIELD AND BACKGROUND

The present invention relates to driver circuits for high-speed data communication systems and, particularly, to source-series terminated (SST) drivers.

Source-series terminated (SST) drivers are versatile building blocks in multi-standard I/O transmitters thanks to their low-power operation, their low area consumption, their full CMOS implementation capability and their flexible termination characteristics. Moreover, the SST drivers support both single-ended output and differential operation.

Usually and as exemplarily disclosed in Document C. Menolfi et al., "A 16 Gb/s source-series terminated transmitter in 65 nm CMOS SOI", ISSCC, Digital Technical Papers, pp. 446-447, February 2007, in order to achieve a robust high-speed operation, a multiplexer is incorporated into the driver that is switched to combine two half-rate data streams to one full-rate output signal.

At high transmission speeds, the performance of existing driver circuits is limited due to nodal charges in the stacked transistor arrangement of the output driver. These charges strongly depend on the transmission history and hence cause a data-dependent timing jitter (intersymbol interference).

For example, in document U.S. Pat. No. 7,511,530 B1 an SST half-rate driver is disclosed having an additional circuitry for minimizing data-dependent jitter and for increasing the frequency amplitude. In order to improve high-speed characteristics, the additional circuitry includes additional discharge switches which are introduced in the driver to effectively reset the nodal charges to zero. The discharge switches are operated to discharge a node in the driver output stage for the purpose of removing the stored charge prior to the next transition cycle of the output stage.

This solution, however, has higher power consumption for driving the additional switches and may add an additional parasitic capacitance at critical internal driver nodes that would limit the achievable data transmission speed.

SUMMARY OF THE INVENTION

According to an embodiment of a first aspect of the invention an inverter-type high speed driver circuit is provided comprising:
 a first inverter branch and a second inverter branch;
 each of the inverter branches comprising a parallel circuit of a serial connection of a first impedance tuning unit and a respective clocking transistor and a serial connection of a second impedance tuning unit and a respective clocking transistor, wherein the impedance tuning units are configured to adapt the conductivity of the respective inverter branch to set the output impedance of the driver circuit;
wherein each of the impedance tuning units is controlled in accordance with a data stream.

Embodiments of the high-speed driver circuit facilitate composing the output data stream from two incoming substreams using an inverter-type topology, wherein floating nodal charges occurring in the stacked transistor arrangement of each inverter branch are reduced. This may be accomplished by decreasing the number of stacked transistors in each inverter branch. While standard high-speed drivers have impedance tuning transistors, data switching transistors and clocked transistors in series for each inverter branch to provide a high-speed driver having both an impedance setting capability and a multiplexing capability to multiplex two incoming data substreams, the above high-speed driver provides a serialization of the data switching and the impedance tuning by firstly generating switched tuning signals which are then applied to the impedance-tuning transistors to combine the data switching and the impedance tuning in the set of parallel impedance-tuning transistors. This allows for reducing the number of stacked transistors in each inverter branch, so that the number of elements in each current path, i.e. path for pull-up currents (through the first inverter branch) and pull-down currents (through the second inverter branch) is reduced, thereby allowing a higher driving performance due to a reduced electrical resistance.

Furthermore, the impedance tuning units may comprise a number of parallelized impedance tuning transistors separately controlled by respective weighted data control signals, wherein an impedance weighting unit is configured to generate the weighted data control signals as a result of an incoming data signal and a given impedance setting signal.

According to an embodiment each of the inverter branches may comprise a resistor serial to the parallel circuit.

It may be provided that the inverter branches are interconnected at a node wherein a resistor is serially connected between an output of the driver circuit and the node. Usually, inverter-type high-speed drivers have series resistors in each inverter branch which cause the charging or discharging times for the node to be substantially increased. Effectively providing only one resistor in the output line while omitting resistors in the inverter branches allows for sharing the series resistors and for improving the transmission rate.

According to a further embodiment, nodes between the first impedance tuning units and the respective clocking transistors of the first and second inverter branches may be interconnected (shortcut) and/or nodes between the second impedance tuning units and the respective clocking transistors of the first and second inverter branches may be interconnected.

This allows the nodal charges in the respective nodes to be balanced which may further improve the driving performance. The shortcut results in the forming of transmission gates with two clocking transistors of the first and second inverter branch while combining the impedance tuning units to have a pull-up and a pull-down branch. Thereby, the node between each two interconnected impedance tuning units and the transmission gate is actively driven such that the above issue of charging or discharging of not directly driven floating nodes can be overcome.

The clocking transistors of the first impedance tuning unit of the first inverter branch and of the second impedance tuning unit of the second inverter branch may be controlled by a clock signal while the clocking transistors of the second impedance tuning unit of the first inverter branch and of the first impedance tuning unit of the second inverter branch are controlled by the inverse clock signal.

It may be provided that the impedance tuning unit consists of two or three or more than three parallelized impedance tuning transistors.

BRIEF DESCRIPTION OF THE DRAWINGS

Preferred embodiments of the present invention are described in more detail in conjunction with the accompanying drawings, in which.

DETAILED DESCRIPTION OF THE INVENTION

Figure 1:
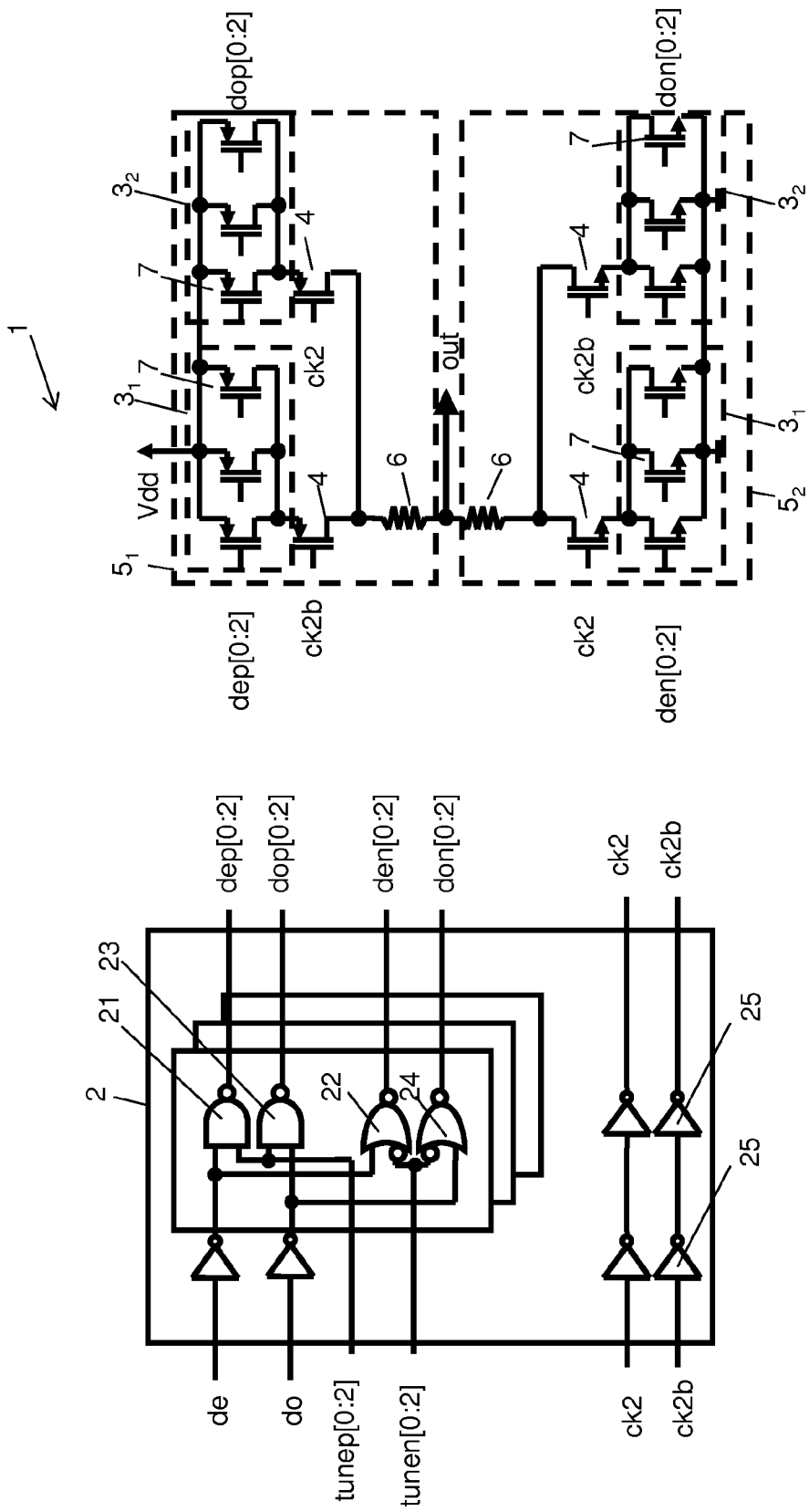
FIG. 1 shows a schematic of a first embodiment of a high-speed driver according to the present invention.

FIG. 1 shows a schematic of a high-speed driver 1. The high-speed driver 1 is comprised of two inverter branches 5, a first and a second inverter branch $5_1$, $5_2$. The first inverter branch $5_1$ is connected between a high supply potential VDD and an output node N, while the second inverter branch $5_2$ is connected between a low supply potential GND and the output node N.

Each inverter branch $5_1$, $5_2$ includes impedance tuning units 3, a first (even) and a second (odd) impedance tuning unit $3_1$, $3_2$. With each impedance tuning unit 3 of each inverter branch $5_1$, $5_2$ a clocking transistors 4 is associated, which is serially coupled with the respective impedance tuning unit 3. For each inverter branch the series connection of the first impedance tuning unit $3_1$ and the respective clocking transistor 4 and of the second impedance tuning unit $3_2$ are coupled in parallel. Furthermore, in each inverter branch $5_1$, $5_2$ the parallel arrangement is connected in series to a resistor 6.

Each impedance tuning unit 3 is provided in the form of a number of paralleled impedance tuning transistors 7 of same or different sizes. Preferably, the size of each of the impedance tuning transistors 7 of the impedance tuning units 3 is predefined relative to one another, wherein the sizes of the impedance tuning transistors 7 of one impedance tuning unit 3 e.g. may differ by a factor of 2 from at least one of the other impedance tuning transistors 7. For example, in case of three impedance tuning transistors 7 of the impedance tuning units 3 (as illustrated in FIG. 1) the sizes are defined by the factors 1, 2 and 4. The impedance tuning transistors 7 of the impedance tuning units $3_1$, $3_2$ of the first inverter branch $5_1$ may be of a first conductivity type, e.g. a p-type and the impedance tuning transistors 7 of the impedance tuning units $3_1$, $3_2$ of the second inverter branch $5_2$ may be of a second conductivity type, such as an n-type.

Impedance tuning transistors 7 of the first impedance tuning unit $3_1$ of the first inverter branch $5_1$ are controlled by control signals dep[0:2], which are generated in a impedance weighting unit 2. Similarly, the impedance tuning transistors 7 of the second impedance tuning unit $3_2$ of the first inverter branch $5_1$ are controlled by control signals dop[0:2]. Impedance tuning transistors 7 of the first impedance tuning unit $3_1$ of the second inverter branch $5_2$ are controlled by control signals den[0:2], which are generated in the impedance weighting unit 2. Similarly, the impedance tuning transistors 7 of the second impedance tuning unit $3_2$ of the second inverter branch $5_2$ are controlled by control signals don[0:2].

The clocking transistors 4 are controlled such that either the first impedance tuning unit $3_1$ of the first inverter branch $5_1$ and the first impedance tuning unit $3_1$ of the second inverter branch $5_2$ are connected via closed associated clocking transistors 4 and via the resistors 6 with the output node N while the clocking transistors 4 associated with the second impedance tuning units $3_2$ are opened (non-conductive), or, vice versa, the second impedance tuning unit $3_2$ of the first inverter branch $5_1$ and the second impedance tuning unit $3_2$ of the second inverter branch $5_2$ are connected via closed associated clocking transistors 4 and via the resistors 6 to the output node N while the respective clocking transistors 4 associated with the first impedance tuning units $3_1$ are opened.

The control signals of the transistors of the impedance tuning units 3 are generated in response to incoming even and odd data signals de, do and an impedance setting signal individually set for the first inverter branch $5_1$ and the second inverter branch $5_2$ by means of a impedance setting unit 10. The impedance setting unit 10 determines the impedance setting signal to adapt the impedance of the high-speed driver 1. The process of setting the impedance of the high-speed driver 1 is well known in the art and further description is omitted herein.

As control signals weighted even data p-type control signals dep[0:2] (weighted data control signals) are obtained by means of a set of three first NAND gates 21 which receive the stream of even data de at their first inputs and a respective bit of a first impedance setting signal tunep[0:2] at their second inputs. The first NAND gates 21 perform a NAND operation. The first impedance setting signal tunep[0:2] indicates a weighting of the data for a setting of the impedance for the first inverter branch $5_1$. The weighted even data p-type control signals dep[0:2] (weighted data control signals) are used to control the impedance tuning transistors 7 of the first impedance tuning unit $3_1$ of the first inverter branch $5_1$.

Moreover, weighted even data n-type control signals den[0:2] (weighted data control signals) are obtained by means of a set of three first NOR gates 22 which receive the stream of even data de at their first inputs and a respective bit of a second impedance setting signal tunen[0:2] at their second inputs. The first NOR gates 22 perform a NOR operation. The second impedance setting signal tunep[0:2] indicates a weighting of the data for a setting of the impedance for the second inverter branch $5_2$. The weighted even data n-type control signals den[0:2] are used to control the impedance tuning transistors 7 of the first impedance tuning unit $3_1$ of the second inverter branch $5_2$.

Similarly, weighted odd data p-type control signals dop[0:2] (weighted data control signals) are obtained by means of a set of three second NAND gates 23 which receive the stream of odd data de at their first inputs and a respective bit of the first impedance setting signal tunep[0:2] at their second inputs. The second NAND gates 23 perform a NAND operation. The weighted odd data p-type control signals dop[0:2] are used to control the impedance tuning transistors 7 of the second impedance tuning unit $3_2$ of the first inverter branch $5_1$.

Moreover, weighted odd data n-type control signals don[0:2] (weighted data control signals) are obtained by means of a set of three second NOR gates 24 which receive the stream of odd data de at their first inputs and a respective bit of a second impedance setting signal tunen[0:2] at their second inputs. The second NOR gates 24 operate a NOR operation. The weighted odd data n-type control signals don[0:2] are used to control the impedance tuning transistors 7 of the second impedance tuning unit $3_2$ of the second inverter branch $5_2$.

The clocking transistors 4 are controlled by clock signals ck2, ck2b which are inverse. The clock signals ck2, ck2b are provided synchronized with the stream of even and odd data de, do, such that with a respective edge or level of the control signal one of the even and odd data signal can be selected. In order to avoid a time offset between the clock signals ck2, ck2b and the even data control signals or odd data control signals, one or more delay elements 25 may be provided to delay the clock signals ck2, ck2b to maintain a synchronization between the data signals and the clock signals ck2, ck2b.

In contrast to conventional high-speed drivers, the above-described high-speed driver 1 has a reduced number of serially stacked transistors in each of the inverter branches $5_1$, $5_2$. This reduces the number of nodes which can be subject to floating charges which can deteriorate the overall driving performance, particularly the maximum data rate.

Figure 2:
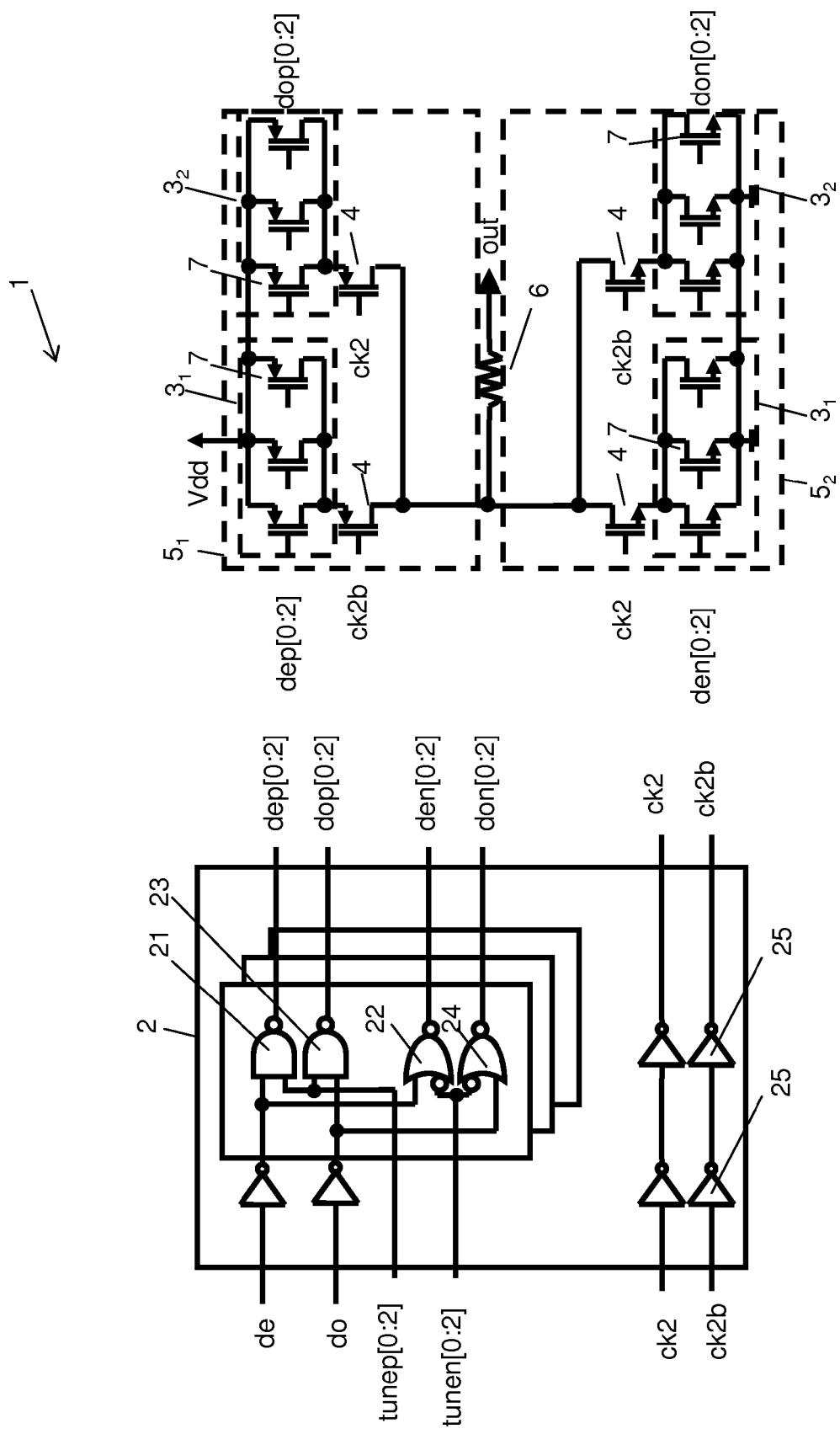
FIG. 2 shows a schematic of a further embodiment of a high-speed driver.

According to a further embodiment, as illustrated in FIG. 2, the series resistors 6 of each inverter branch $5_1$, $5_2$ are omitted and replaced by a single output resistor 6 which is serially connected in the output line. Thereby, non-driven high-impedance nodes between the resistors 6 and the respective clocking transistors 4 in each inverter branch 5$_1$, 5$_2$ can be avoided. This substantially increases the slew rate of the high-speed driver 1.

Figure 3:
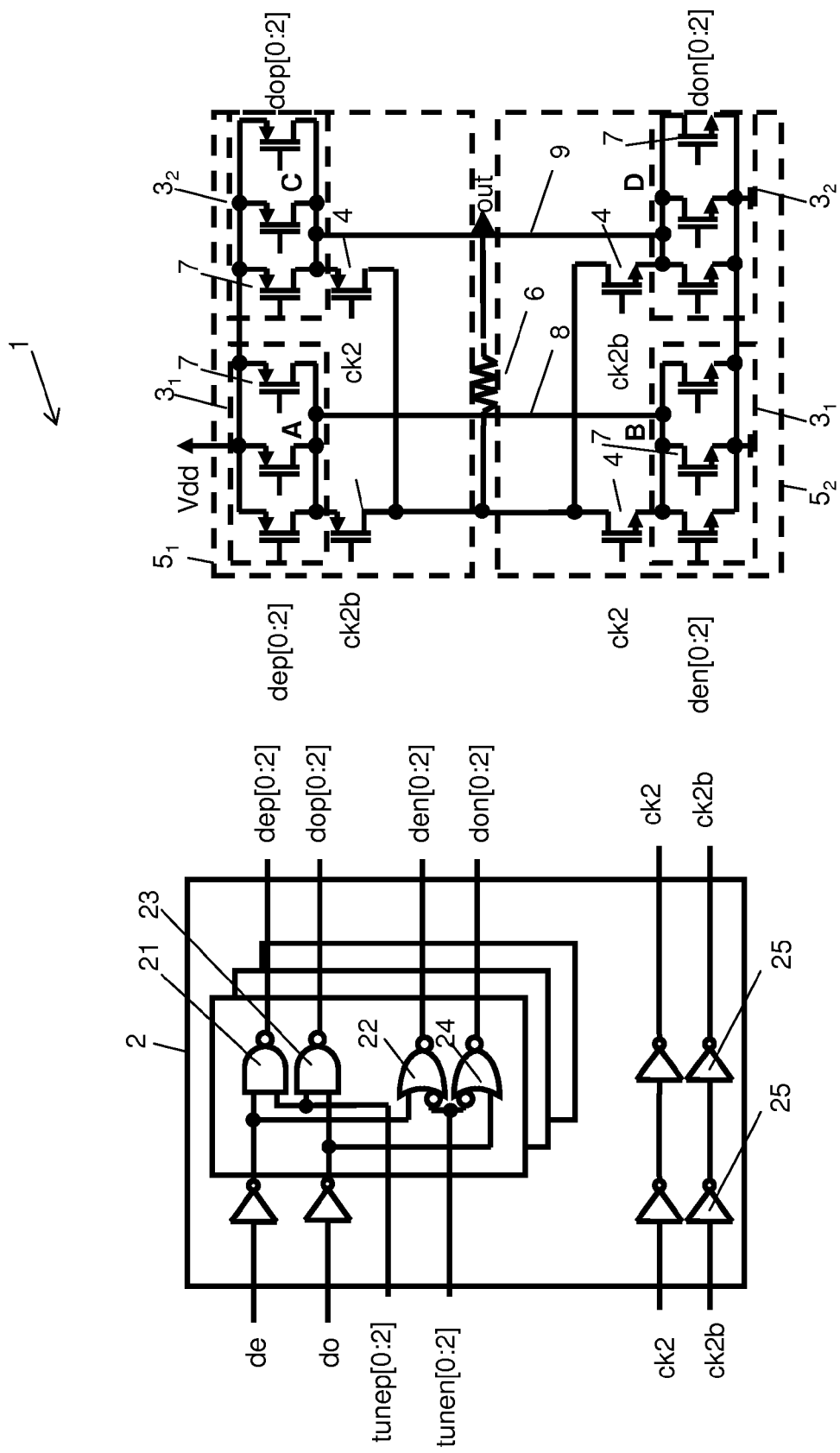
FIG. 3 shows a schematic of a further embodiment of a high-speed driver.

FIG. 3 shows another schematic of a high-speed driver 1, wherein the high impedance node A between the first impedance tuning unit 3$_1$ and the associated clocking transistor 4 of the first inverter branch 5$_1$ and the high impedance node B between the first impedance tuning unit 3$_1$ and the respective clocking transistor 4 of the second inverter branch 5$_2$ are interconnected by means of a first shortcut line 8 and wherein a high impedance node C between the second impedance tuning unit 3$_2$ and the associated clocking transistor 4 of the first inverter branch 5$_1$ and the high impedance node D between the second impedance tuning unit 3$_2$ and the respective clocking transistor 4 of the second inverter branch 5$_2$ are interconnected by a second shortcut line 9.

This results in a circuit, wherein the first and second impedance tuning units 3 for the respective first and second inverter branches 5$_1$, 5$_2$ each form a single driver for even data de and odd data do which are coupled with the output node N via respective transmission gates which are alternately clocked by the clock signals ck2, ck2b. In general, a transmission gate is formed by two transistors of different conductivity types, their source and drain terminals are interconnected and which are controlled by inverted signals. The driver formed by the first and second impedance tuning units 3 has the advantage that all potential high impedance nodes are actively driven and no potentially floating nodes exist within the high-speed output driver 1. In general, the impedance tuning units 3 are rendered to being active drivers without high impedance nodes, wherein the output of the now actively driving impedance tuning units 3 is gated by the transmission gate to the output node N.

While according to conventional output drivers each inverter branch has a series of transistors including at least several of the clocking transistors, data transistors and impedance tuning transistors of the impedance tuning units 3, wherein a number of high impedance nodes are established, the high-speed output driver 1 according to FIG. 3 has a data weighting unit to weight the input data with a respective impedance setting signal tunep[0:2], tunen[0:2], an actively driving impedance tuning unit 3 for receiving the impedance setting signals tunep[0:2], tunen[0:2], such that the overall impedance of the input driver may be adapted according to the impedance setting signals tunep[0:2], tunen[0:2], and a serially connected transmission gate for each data substream to alternately connect the weighted and driven data signals to the output node N.

The invention claimed is:

1. An inverter-type high speed driver circuit comprising:
a first inverter branch and a second inverter branch, wherein each of the inverter branches comprising a parallel circuit of a serial connection of a first impedance tuning unit and a respective first clocking transistor and a serial connection of a second impedance tuning unit and a respective second clocking transistor, wherein the impedance tuning units are configured to adapt conductivity of a respective inverter branch to set an output impedance of the driver circuit; wherein each of the impedance tuning units is controlled in accordance with a data stream.

2. The driver circuit according to claim 1, wherein each impedance tuning unit comprises a plurality of parallelized impedance tuning transistors separately controlled by respective weighted data control signals, and wherein an impedance weighting unit is provided to generate weighted data control signals as a result of an incoming data signal and a given impedance setting signal.

3. The driver circuit according to claim 1, wherein each of the inverter branches comprises a resistor in series to the parallel circuit.

4. The driver circuit according to claim 1, wherein the inverter branches are interconnected at a node wherein a resistor is serially connected between an output of the driver circuit and the node.

5. The driver circuit according to claim 1, having one of nodes between the first impedance tuning unit and the respective clocking transistors of the first and second inverter branches are interconnected or nodes between the second impedance tuning unit and the respective clocking transistors of the first and second inverter branches are interconnected.

6. The driver circuit according to claim 1, wherein the first clocking transistor of the first impedance tuning unit of the first inverter branch and the second clocking transistor of the second impedance tuning unit of the second inverter branch are controlled by a clock signal while the second clocking transistors of the second impedance tuning unit of the first inverter branch and of the first impedance tuning unit of the second inverter branch are controlled by the inverse clock signal.

7. The driver circuit according to claim 1, wherein each impedance tuning unit comprises at least two parallelized impedance tuning transistors.

* * * * *